US011109486B2

(12) United States Patent
Ma et al.

(10) Patent No.: US 11,109,486 B2
(45) Date of Patent: Aug. 31, 2021

(54) HIGH-SPEED, FLEXIBLE INTEGRATED CIRCUITS AND METHODS FOR MAKING HIGH-SPEED, FLEXIBLE INTEGRATED CIRCUITS

(71) Applicant: Wisconsin Alumni Research Foundation, Madison, WI (US)

(72) Inventors: Zhenqiang Ma, Middleton, WI (US); Guoxuan Qin, Tianjin (CN); Namki Cho, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 135 days.

(21) Appl. No.: 16/658,515

(22) Filed: Oct. 21, 2019

(65) Prior Publication Data
US 2020/0084891 A1    Mar. 12, 2020

Related U.S. Application Data

(62) Division of application No. 13/724,051, filed on Dec. 21, 2012, now abandoned.

(60) Provisional application No. 61/580,001, filed on Dec. 23, 2011.

(51) Int. Cl.
| | |
|---|---|
| *H05K 1/00* | (2006.01) |
| *H05K 7/06* | (2006.01) |
| *H01L 21/762* | (2006.01) |
| *H01L 21/764* | (2006.01) |
| *H01L 23/538* | (2006.01) |
| *H05K 1/18* | (2006.01) |
| *H05K 3/28* | (2006.01) |
| *H01L 21/683* | (2006.01) |

(52) U.S. Cl.
CPC ......... *H05K 1/189* (2013.01); *H01L 21/6835* (2013.01); *H05K 1/185* (2013.01); *H05K 3/284* (2013.01); *H01L 2221/6835* (2013.01); *H01L 2221/68363* (2013.01); *H01L 2221/68381* (2013.01); *H05K 2201/0133* (2013.01); *H05K 2203/308* (2013.01)

(58) Field of Classification Search
CPC .......... H05K 1/00; H05K 1/185; H05K 1/189; H05K 3/284; H05K 7/06; H01L 21/762; H01L 21/764; H01L 21/6835; H01L 21/76264
USPC ......... 361/749; 174/110, 127; 257/679, 777, 257/787, E21.545, E21.564
See application file for complete search history.

(56) References Cited

U.S. PATENT DOCUMENTS

| | | | | |
|---|---|---|---|---|
| 3,949,343 A | * | 4/1976 | Yonkers | H01H 9/085 337/192 |
| 7,893,781 B2 | * | 2/2011 | Six | H03H 9/02259 331/116 M |

(Continued)

*Primary Examiner* — Xiaoliang Chen
(74) *Attorney, Agent, or Firm* — Bell & Manning, LLC; Michelle Manning

(57) ABSTRACT

The present invention provides flexible devices, such as integrated circuits, having a multilevel electronic device structure including two or more electronic components. The electronic components within the structure are electrically connected by an interconnect structure having multiple interconnect levels. In addition to the multilevel electronic device structure, the flexible devices include an elastomeric material disposed around the interconnect levels, including within the spaces between the interconnect levels.

7 Claims, 6 Drawing Sheets

(56) References Cited

U.S. PATENT DOCUMENTS

2008/0302559 A1* 12/2008 Leedy .................... H01L 21/764
                                                            174/254
2009/0273909 A1* 11/2009 Shin .................... H01L 23/5387
                                                            361/749
2011/0276116 A1* 11/2011 Maxfield .............. A61N 1/0563
                                                            607/116

* cited by examiner

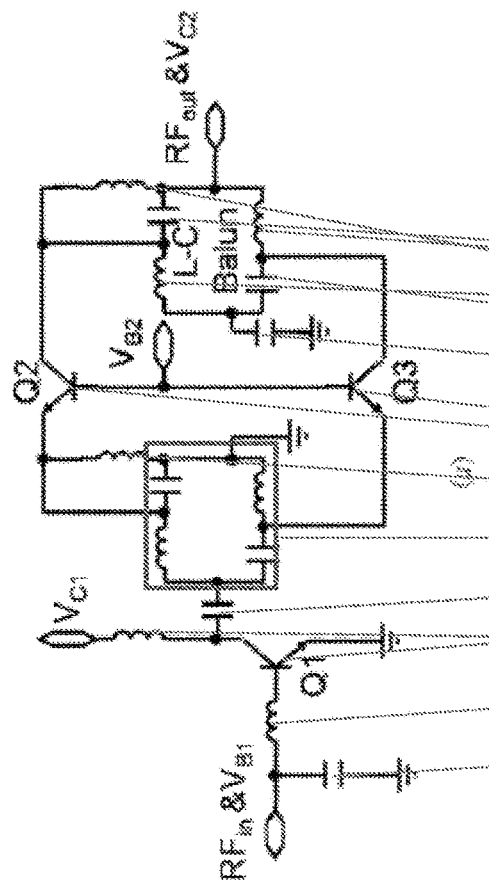
FIG. 5
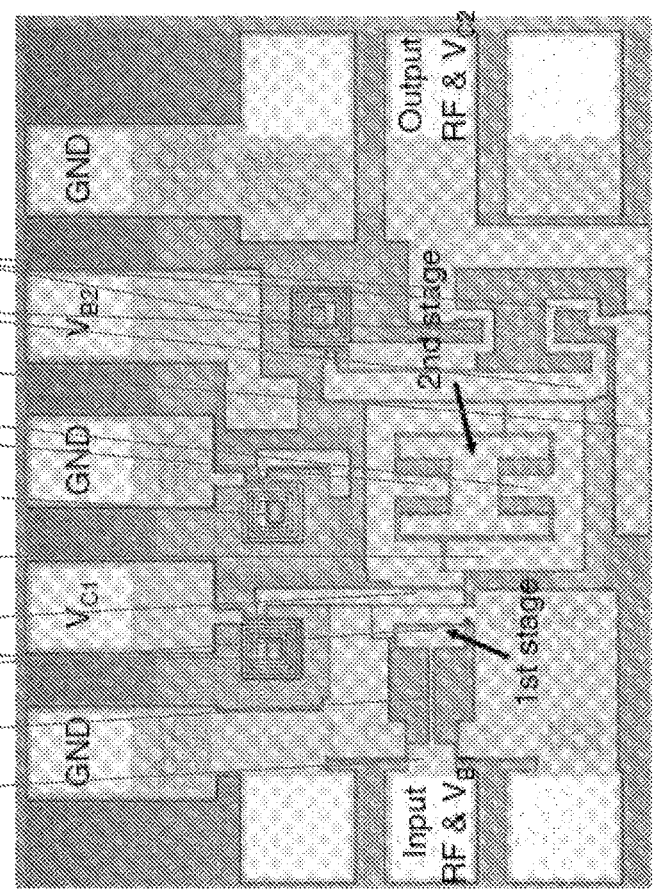
FIG. 2 with Component Labeled

HIGH-SPEED, FLEXIBLE INTEGRATED CIRCUITS AND METHODS FOR MAKING HIGH-SPEED, FLEXIBLE INTEGRATED CIRCUITS

CROSS-REFERENCE TO RELATED APPLICATIONS

The present application is a divisional of U.S. application Ser. No. 13/724,051, filed Dec. 21, 2012, the entire contents of which is incorporated herein by reference. U.S. application Ser. No. 13/724,051 claims priority to U.S. provisional patent application No. 61/580,001 that was filed Dec. 23, 2011, the entire contents of which is incorporated herein by reference.

STATEMENT OF GOVERNMENT RIGHTS

This invention was made with government support under grant number FA9550-09-1-0482 awarded by the United States Air Force. The government has certain rights in the invention.

BACKGROUND

Flexible, light weight, extremely bendable (i.e., foldable and rollable) electronics, would enable many new applications that are not easily accessible using their conventional rigid electronics counterparts. Applications of flexible electronics range from displays, imagers and biomedical devices, that can be easily operated at low-speeds, to radio-frequency (RF) communication systems, aerospace radar and other wireless devices that require high-speed (e.g., GHz to tens of GHz) operation. Organic and some inorganic semiconductor-based electronics can provide extreme bendability, but they cannot be operated at high speeds due to their low carrier mobility. Recently, single-crystal semiconductor flexible membranes and micro-strips that have high carrier mobilities and can be transferred to flexible host substrates have enabled the operation of flexible thin-film transistors (TFTs) in the RF frequency range. However, further improvement of the speed of these TFTs directly fabricated on flexible substrates (e.g., plastic) will become more challenging as substantial downscaling of the critical dimension with high alignment precision (e.g., between gate and source/drain) on flexible (typically soft and slightly stretchable) substrates to enhance device speeds becomes prohibitive.

High-speed electronics are readily available on rigid substrates. The conventional way to achieve high flexibility with rigid-wafer based electronics is to wire-connect individual chips, which is considered cost ineffective and unreliable. Attempts have been made to thin rigid substrates to achieve flexibility. However, such limited flexibility can only be achieved at the wafer level. To enhance the flexibility of rigid substrate-based electronics, thin flexible chip have been fabricated by completely removing the handling substrate of electronics built on silicon-on-insulator (SOI) structures. Such thin flexible substrates show enhanced flexibility. However, they are brittle at small bending radii even if they are mounted on plastic substrates. This brittleness can be attributed to the multi silicon oxide ($SiO_x$) layers that are present between the levels of the multilevel interconnects needed to connect the densely packed devices on chips. Clearly, the densely packed multilayer metal interconnections, which are crucial for more advanced devices or integrated circuits (ICs), present an substantial obstacle to the fabrication of extremely flexible and ultra-high performance electronics.

SUMMARY

One aspect of the present invention provides flexible devices comprising a multilevel electronic device structure having at least two electronic components electrically connected by an electrical interconnect structure with multiple interconnect levels; and an elastomeric dielectric material disposed around the electrical interconnect structure, including within spaces between the interconnect levels. The dielectric material may also be disposed over the front and back sides of the electronic device structure, such that the electronic components and the electrical interconnect structure are encased in the elastomeric dielectric material.

The flexible devices are desirably free, or substantially free, of rigid inorganic dielectric material between interconnect levels, other that inorganic dielectric materials that form part of a device active region. The absence or substantial absence of rigid dielectric layers in the devices renders them flexible, while the presence of the flexible dielectric material provides flexibility without sacrificing performance. Examples of rigid inorganic dielectric materials include oxides and ceramics, such as $SiO_2$ and $SiN_x$.

Examples of elastomeric dielectric materials that can be used in the devices include poly(dimethylsiloxane) and parylene.

The flexible devices can be simple devices with only a small number of electrically connected components, or more complex integrated circuits comprising a plurality of transistors, diodes, capacitors, and the like.

Another aspect of the invention provides methods for fabricating a flexible device from a rigid device, the rigid device comprising a multilevel electronic device structure having at least two electronic components electrically connected by an electrical interconnect structure with multiple interconnect levels; and a rigid dielectric material disposed around the electrical interconnect structure, including within spaces between the interconnect levels. The methods include the steps of removing the rigid dielectric material to expose the electrical interconnect structure; backfilling the resulting spaces between the interconnect levels with a liquid elastomeric dielectric precursor; and curing the liquid elastomeric dielectric precursor to form an elastomeric dielectric material between the interconnect levels.

The methods can further include the steps of coating the front side and the back side of the electronic device structure with a liquid elastomeric dielectric precursor, and curing the liquid elastomeric dielectric precursor to form an elastomeric material on the front side and the back side of the device, such that the electronic components and the electrical interconnect structure are encased in elastomeric dielectric material.

The rigid dielectric material can be removed, for example, using an etchant. Examples of common rigid dielectric materials include $SiO_2$, $SiN_x$ or a combination thereof. An example of a suitable selective etchant is HF. If the electronic components include active device regions comprising a rigid dielectric, those active device regions can be protected prior to etching the rigid dielectric material.

BRIEF DESCRIPTION OF THE DRAWINGS

FIG. 2 shows scanning electron microscope (SEM) images of an integrated circuit having four aluminum interconnect levels during three stages of the transformation process.

FIGS. 3 (B) and (D) show SEM images of the upper level regions of the power amplifier integrated circuit (IC) before and after removal of the rigid dielectric material around the interconnect structure.

FIG. 5 shows a circuit diagram of the two-stage 24 GHz power amplifier, as described in greater detail in the example below.

DETAILED DESCRIPTION

Figure 1:
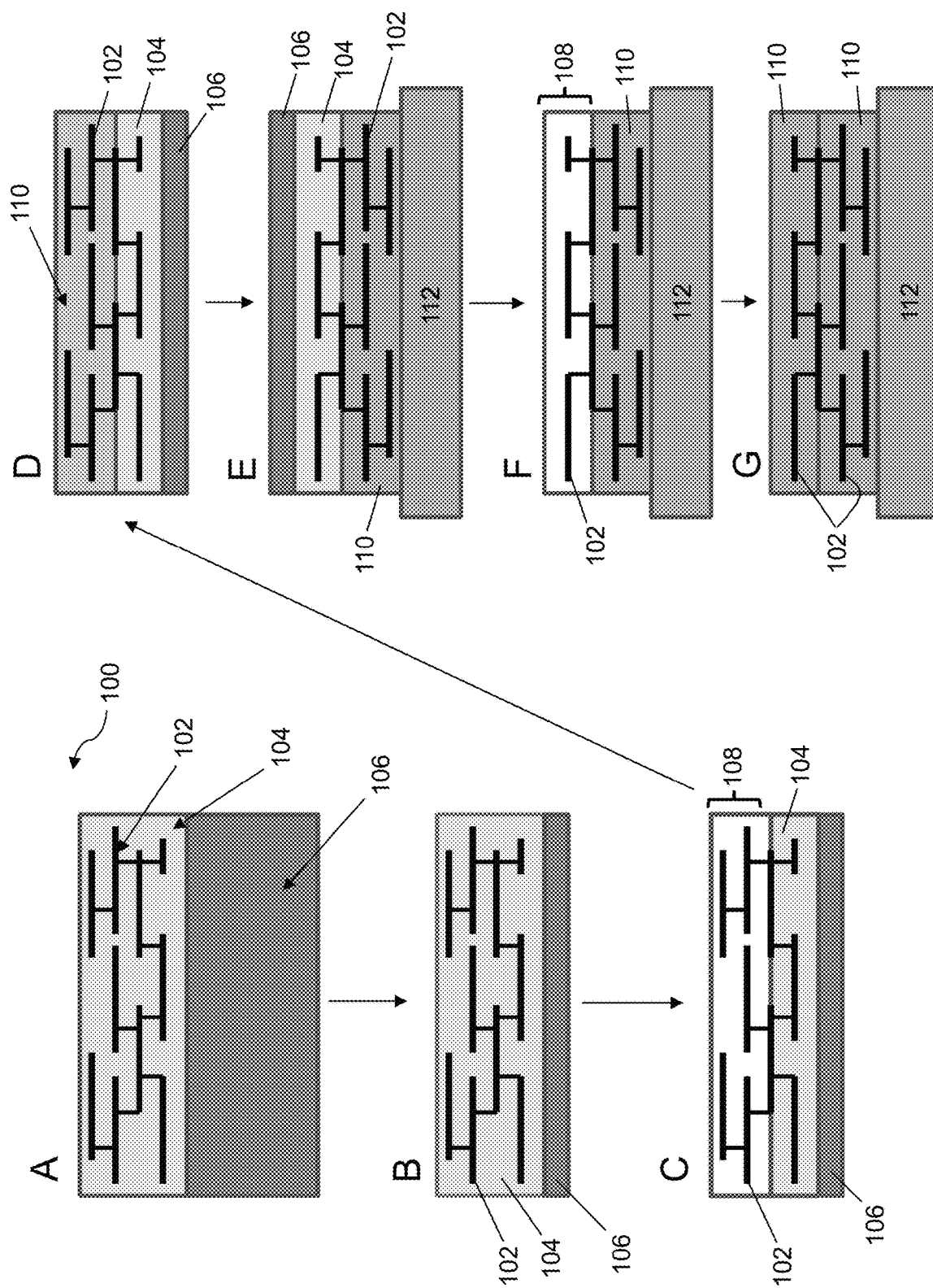
FIG. 1 is a schematic illustration of a method for transforming a rigid integrated circuit into a flexible integrated circuit in accordance with the present invention.

One aspect of the present invention relates to flexible integrated circuits. In various embodiments, the integrated circuits are flexible enough to the bent, rolled and folded, yet still provide high-speed microwave and millimeter-wave electronics. The flexible integrated circuits can be fabricated by a direct transformation of commercial foundry-processed rigid chips having conventional multilevel metal interconnects, without the need for new processing tools. As such, the methods present accessible routes to exceptionally high performance and high-density, yet very flexible electronic devices, such as flexible wired/wireless communication systems, foldable aerospace surveillance radars and wireless biomedical devices, that require extreme mechanical deformations during installation and/or use, as well as operation speeds as high as those that can be achieved with rigid integrated circuits.

In one basic embodiment, the present flexible devices include a multilevel electronic device structure comprising two or more electronic components. The electronic components within the structure are separated and connected by an electrical interconnect structure having multiple interconnect levels. In addition to the multilevel electronic device structure, the flexible devices include an elastomeric material disposed around the interconnect levels, including within the spaces between the interconnect levels. In some embodiments, the dielectric elastomeric material is also disposed over the front and back sides of the electronic device structure, such that the device components and the electrical interconnect structure are encased in the elastomeric dielectric material. (As used herein, an encased structure includes structures where one or more portions of the electrical interconnect structure or device components are exposed to allow, for example, external connections to be made to the components and/or integrated circuit.)

The flexible devices can be fairly simple electronic devices comprising a small number (e.g., two, three or four) of electrical components, or can be more complex integrated circuits having tens or hundreds of electronic components. Examples of electronic components that can be electrically connected by the electrical interconnect structure include active components (e.g., semiconductor-based components) and passive components. For example, the device components can be transistors, capacitors, resistors, and diodes. By way of illustration only, the types of transistors that can be present include heterojunction bipolar transistors (HBT), MOSFETs and high electron mobility transistors (HEMTs).

The flexible devices can be fabricated from conventional rigid electronic devices and integrated circuits using conventional methods, materials and equipment. This process is shown schematically for the transformation of an integrated circuit having four interconnect levels in FIG. 1. Conventional integrated circuits 100 typically include a multilevel electronic device structure having at least two electronic components (not shown) electrically connected by an electrical interconnect structure 102. The electrical interconnect structure is typically made of a metal, such as aluminum, copper, platinum or gold. The electrical interconnect structure has at least two levels, where different levels are distinguished as occupying different positions along the vertical axis running through the front and back sides of the integrated circuit, perpendicular or substantially perpendicular to the device substrate. In some embodiments, the electrical interconnect structure has at least three levels, this includes embodiments in which the electrical interconnect structure has at least four levels and further includes embodiments in which the electrical interconnect structure has at least 10 levels.

The electronic components and electrical interconnect structure of the rigid integrated circuit is initially encased in a rigid dielectric material 104. Common rigid dielectric materials include inorganic materials, such as oxides and ceramics. Two specific examples of such materials are $SiO_2$ and $SiN_x$.

The rigid circuit may initially be supported by a bulk support substrate 106, such as a silicon wafer. If this is the case, the conversion process can begin by thinning the support substrate 106 using, for example, a wafer grinding process, as shown in panel (B) of FIG. 1. The rigid dielectric material can then be selectively removed from the multilevel electronic device structure and replaced with a flexible organic dielectric material. These steps can be accomplished using a two-sided approach. Using this approach, a front side etch is used to expose one or more levels 108 of the electronic interconnect structure from the front (top) side (panel (C)) and the spaces between and around the exposed levels are then backfilled with a liquid elastomer dielectric precursor. The liquid elastomeric dielectric precursor is subsequently cured to provide a flexible, elastomeric dielectric material 110 between and around the interconnect levels at the top side of the integrated circuit (panel (D)). For the purposes of this disclosure, cure means to go from a liquid state to a solid state. Examples of curing processes including drying and crosslinking. Next, the previously thinned support substrate is removed, the integrated circuit is turned over and the process illustrated in panels (C) and (D) of FIG. 1 is repeated on the back side of the integrated circuit to provide a flexible integrated circuit, wherein the rigid material between the interconnect levels has been replaced with a flexible organic elastomer which fills the spaces between the interconnect levels. Thus, as shown in panel (E), the structure can be flipped over onto a host substrate 112. The remainder of support substrate 106 can then be removed and an etch can be used to expose one or more levels 108 electronic interconnect structure 102 (panel (F)). The spaces between and around the newly exposed levels are then backfilled with a liquid elastomer dielectric precursor, which is subsequently cured to provide a flexible elastomeric dielectric material 110 between and around the interconnect levels (panel (G)). For the purposes of this disclosure, the spaces between the interconnect levels can be considered to be filled even if there is some unfilled volume or air pockets remaining due to imperfect backfilling, provided that the backfilling is sufficiently complete to provide a flexible, operable device or circuit with adequate electrical insulation.

The removal of the rigid dielectric material can be accomplished by selectively etching away the rigid dielectric material. The etch can be a dry etch, a wet etch, or a combination thereof. For example, if the rigid dielectric material is $SiO_2$ or $SiN_x$, a hydrofluoric acid (HF) etch can be used, as illustrated in greater detail in the examples. In some embodiments, it can be desirable for portions of the rigid dielectric material to remain in the integrated circuit to provide a passivation layer or an active device region. For example, if a rigid dielectric material provides the gate or drain oxides of a MOSFET, those portions of the rigid dielectric material that provide said oxides can be protected prior to the removal of the remaining rigid dielectric material.

The liquid elastomeric dielectric precursor is a liquid-phase material that cures (e.g., crosslinks and/or dries) to form a flexible, solid elastomeric matrix around the electrical interconnect structures. The liquid precursor can be applied by any method that accomplishes the backfilling of the exposed electrical interconnect structure. For example, in some embodiments, the liquid dielectric precursor is spin coated onto the electrical interconnect structure. The elastomeric dielectric materials used in the present invention are organic materials that have the ability to undergo deformation under the influence of a force and regain their shape once the force has been removed. The use of these materials as intervening layers in the present integrated circuits provides them with a substantial degree of flexibility. Examples of dielectric elastomers are poly(dimethylacrylamide) (PDMA) and parylene.

The flexible integrated circuits can be quite thin. For example, in some embodiments the flexible integrated circuits have a thickness of no greater than about 50 μm (e.g., about 5 to about 40 μm or about 10 to about 20 μm). This includes embodiments in which the flexible integrated circuits have a thickness of no greater than about 30 μm and embodiments in which the flexible integrated circuits have a thickness of no greater than about 10 μm.

The flexible devices and circuits can be bent and even rolled into cylinders without experiencing a significant decrease in their performance. For the purposes of this disclosure, a decrease in performance would be considered significant if it rendered the device or circuit inoperable for its primary function. The extent to which a decrease in performance is acceptable will depend on the nature of the particular device or circuit, however, in some embodiments the performance properties (e.g., speed of operation, carrier mobility, etc.) of the flexible devices provided herein differ by no more than 10% from the performance properties of their rigid counterparts. This includes embodiments in which the performance properties of the flexible devices differ by no more than 5%, or even no more than 1%, from the performance properties of their rigid counterparts.

Some embodiments of the present flexible devices have a convex bending radius of 20 mm or smaller without experiencing a significant decrease in their performance. This includes embodiments in which the flexible devices have a convex bending radius of 15 mm or smaller, or even 10 mm or smaller, without experiencing a significant decrease in their performance.

Certain embodiments of the present high-speed, flexible integrated circuits are illustrated in the following examples.

EXAMPLES

The following example illustrates the use of the present methods to make flexible, high-speed SiGe HBTs and a SiGe-HBT power amplifier circuit chip.

For this example, high performance, individual SiGe HBT device arrays and a millimeter wave SiGe HBT power amplifier circuit chip, both with four metal interconnect layers, were designed and fabricated as conventional rigid devices and chips at commercial foundries. The rigid structures were then transformed into flexible devices and chips. The transformed structures exhibited superior flexibility and robustness, while maintaining their high frequency response characteristics. The individual HBT devices had a figure of merit $f_{max}$ ~40 GHz and the power amplifier circuit had a ~14 dB power gain at ~24 GHz. A finite element method (FEM) simulation used to assess the flexibility of the chips revealed significant improvements in flexibility achieved using the present methods.

Materials:

The individual HBT devices and 24 GHz power amplifier were manufactured by Jazz Semiconductor, Inc. using the 0.18 μm SiGe90 process. The individual devices had a high breakdown collector profile design with BVCEO ~7V and BVCBO ~20V. The subcell SiGe HBTs used in the power amplifier had a low breakdown voltage with BVCEO ~3.5V and BVCBO ~12.5V. The integrated circuits (ICs) had an electrical interconnect structure with four aluminum (Al) metal layers, the thickness of the topmost metal layer being ~5 μm. The 24 GHz power amplifier integrated circuit (shown in FIG. 5) had two amplifying stages, L-C matching circuit and ground-signal-ground (GSG) pads for grounding, and DC bias and input and output RF and DC signals.

Methods:

The individual HBT devices and power amplifier ICs on a bulk Si substrate (~5 mm*5 mm) were first subjected to dry etching with a halocarbon 14 ($CF_4$) plasma system (Unaxis 790 RIE system, 40 sccm $SF_6$ flow with a chamber pressure of 50 mTorr at 100 W RF power for ~15 min). Then the devices and ICs were exposed to highly concentrated (49%) HF for ~1 min to remove most of the rigid $SiO_2$ dielectric material around the interconnect structure. The devices and ICs were then quickly and carefully rinsed to prevent the Al metal from etching (i.e., to avoid the formation of $H_3O^+$ induced by mixing concentrated HF with water). After the wet etching, another $CF_4$ plasma dry etching step was conducted for ~30 min to remove the $SiN_x$ layer and to further remove the $SiO_2$ close to the device active regions. During the etching steps, the etching time was carefully controlled and adjusted according to the specific layout of the respective devices and ICs. The device active regions disposed on the metal interconnect levels were protected with careful control of the etching time and mask designs.

After the etching steps, the multilevel electrical interconnect structures of the HBT devices and ICs were fully exposed. Liquid-form poly(dimethylsiloxane) (PDMS) elastomeric dielectric precursor was then spin coated onto the front side of the device or IC to backfill the empty space around the interconnect structure. The thickness of the PDMS coating layer was controlled by applying different spin coating parameters (e.g., ~1.5 μm at ~4000 rpm for 30 sec; ~100 μm at ~1000 rpm for 60 sec). After the liquid-form PDMS precursor was crosslinked at 80° C. for ~4 h (or room temperature for ~24 h), PDMS rubber was formed, which provided an elastomeric dielectric material disposed around the interconnect structure, including between the electrical interconnect levels to hold the metal interconnect "skeleton" together.

After the front side of the device or IC was coated by PDMS, the back side Si of the device or IC was ground to ~50 µm (Grinding and Dicing Services, Inc., USA). $SF_6$ plasma dry etching (Unaxis 790 RIE system, 40 sccm $SF_6$ flow with a chamber pressure of 50 mTorr at 100 W RF power for ~15 min) was then conducted to further remove the back side Si. Alternatively, deep-RIE (DRIE, STS Multiplex ICP Etch) or KOH wet etching can be employed for this step. After this etching step, the device active regions of the device or IC were protected by a photoresist and then a lower-power $SF_6$ plasma dry etching process was performed to fully remove the back side Si. After removing the photoresist with acetone, liquid-form PDMS dielectric elastomeric precursor was spin coated onto the back side of the structures. The spin coating parameters were the same as those used to spin coat the front side of the structure so that the thicknesses of the PDMS layers were the same on both sides. After the PDMS was cured, the densely packed devices and ICs with multilevel metal interconnect structures were fully transformed and embedded in the PDMS.

FIG. 2 shows SEM images of the four-level structure at various stages of processing. This top panel shows the original, rigid IC as fabricated. The center panel shows the IC after the rigid dielectric material has been removed. The bottom panel shows the IC after is has been backfilled and embedded in PDMS.

FEM Simulations:

A theoretical analysis was conducted to study the flexibility, as measured by the displacement along the bending direction, of the devices and ICs. The deformation was derived from the principle of virtual work (displacement is the primary unknown variable) according to equation 1:

$$\int_V \sigma_{ij} \delta e_{ij} dV = \int_S f_i^B \delta u_i dV + \int_S f_i^S \delta u_i dS \quad (1),$$

where:

$\sigma_{ij}$=Cauchy stress component;

$$e_{ij} = \frac{1}{2}\left(\frac{\partial u_i}{\partial x_j} + \frac{\partial u_j}{\partial x_i}\right) = \text{deformation tensor;}$$

$u_i$=displacement;
$x_i$=current coordinate;
$f_i^B$=component of body force;
$f_i^S$=component of surface traction;
V=volume of deformed body;
S=surface of deformed body on which tractions are prescribed; and
$c_{ijkl}$=material constitutive tensor.

In this analysis, the displacement along the bending direction can be indicated by equations 2 and 3:

$$\delta W = \int_V \sigma_{ij} \delta e_{ij} dV \quad (2)$$

and $$D\delta W = \int_V \delta e_{ij} c_{ijkl} De_{kl} dV + \int_V \sigma_{ij} \left(\frac{\partial \delta u_k}{\partial x_i} \frac{\partial Du_k}{\partial x_j} - \delta e_{ik} De_{kj}\right) dV. \quad (3)$$

For a multilevel structure, the equivalent tension rigidity and bending rigidity can be drawn according to the displacement from the equations above. Three-dimensional FEM simulations were performed using a commercial ANSYS package based on the theoretical equations. An eight node solid volume element was defined for the multilevel structures. A two-level structure was used as a model structure and representative dimensions were chosen. The values of the mechanical properties (i.e., density, Poisson's ratio, Young's modulus, shear modulus, etc.) of the materials (Al, $SiO_2$, PDMS) were supplied and the materials were glue bonded together.

Characterization:

A LEO Gemini 1530 Field Emission Scanning Electron Microscope (FESEM) was used to take SEM images of the structures. The DC characteristics (forward mode Gummel Plot) were measured by an Agilent semiconductor parameter analyzer 4155. 50 GHz GSG Cascade probes were used for the input and output signals. A picoprobe multi-contact GSGSG probe was used for extra grounding and a DC bias of the 24 GHz PA circuit. An Agilent 8346A parameter network analyzer was employed for the small-signal AC measurement and was calibrated from 45 MHz to 50 GHz. An Agilent E3631A power supply was used to provide the DC power for the PA. On-wafer probing was conducted for the measurement. Small-signal scattering-parameters (S-parameters) from 45 MHz to 50 GHz were measured for the individual devices and the power amplifier circuit (small-signal power gain can be obtained accordingly). The thicknesses of the layers in the structures were measured by a Tencor Alphastep 200 profilometer. Samples were mounted on curvature modes with different radii (convex 77.5 mm, 28.5 mm, 21 mm, 15.5 mm, and concave 85 mm) to do the bending measurements.

Figure 3B:
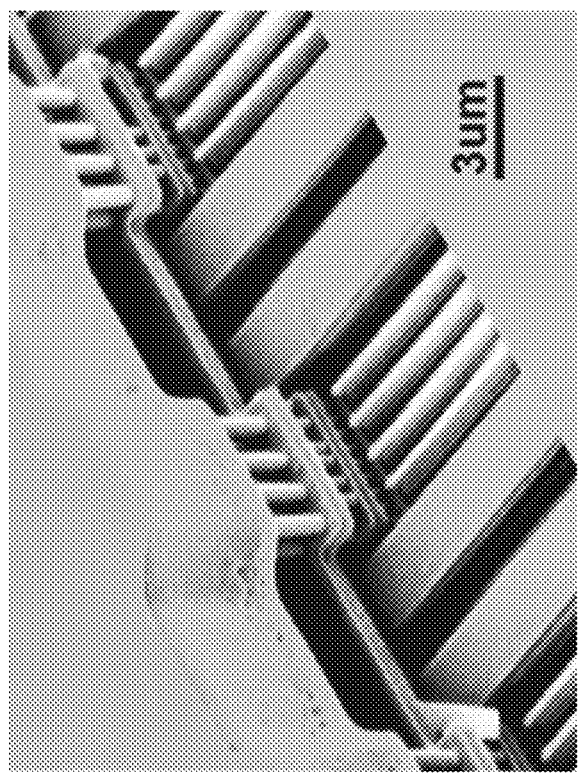
FIGS. 3 (A) and (C) show SEM images of a HBT device subcell for a power amplifier circuit before and after removal of the rigid dielectric material around the electrical interconnect structure.
Figure 3A:
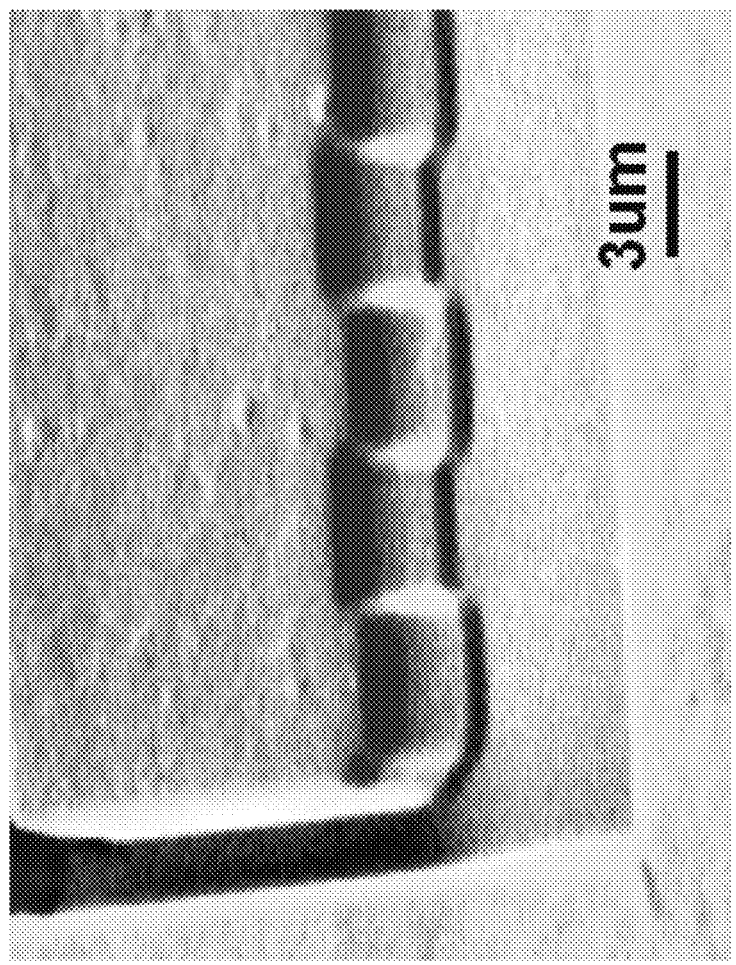
Figure 3D:
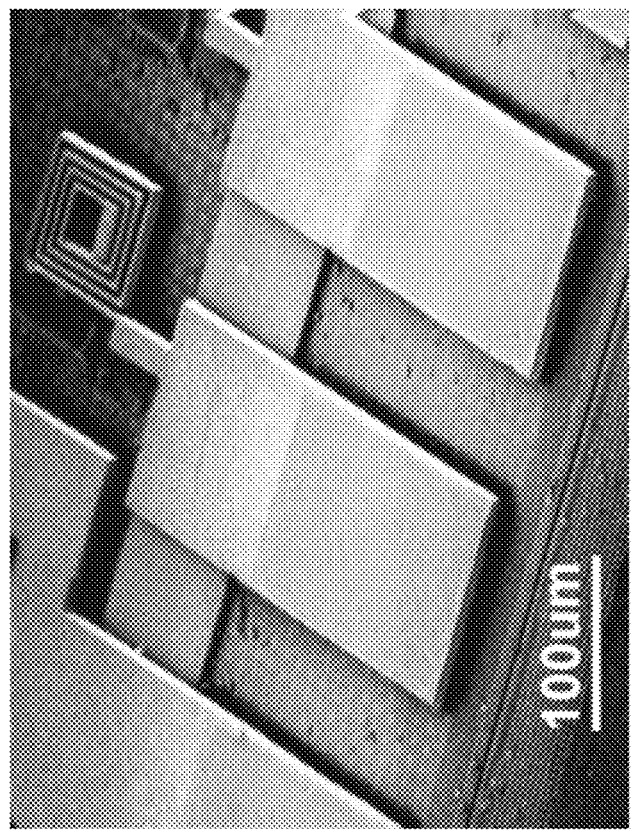
Figure 3C:
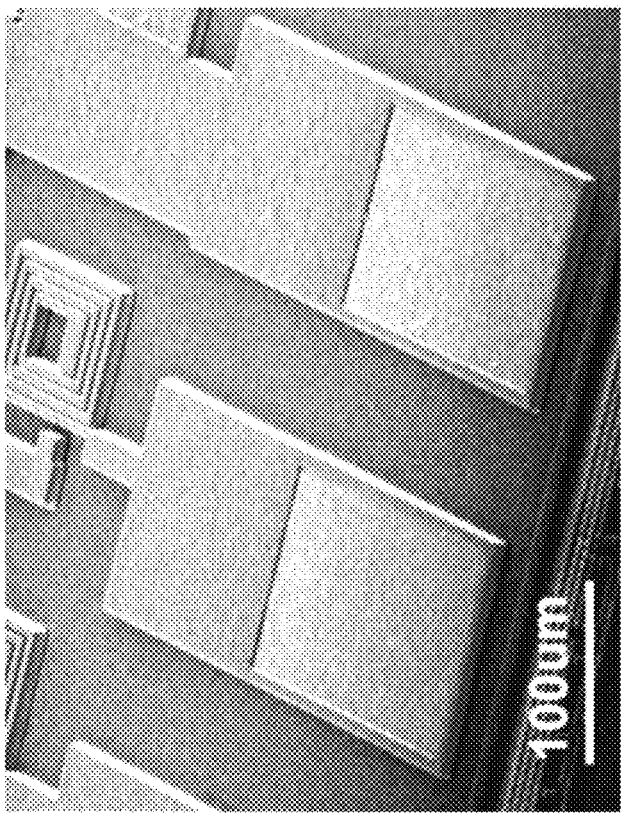
Figure 4A:
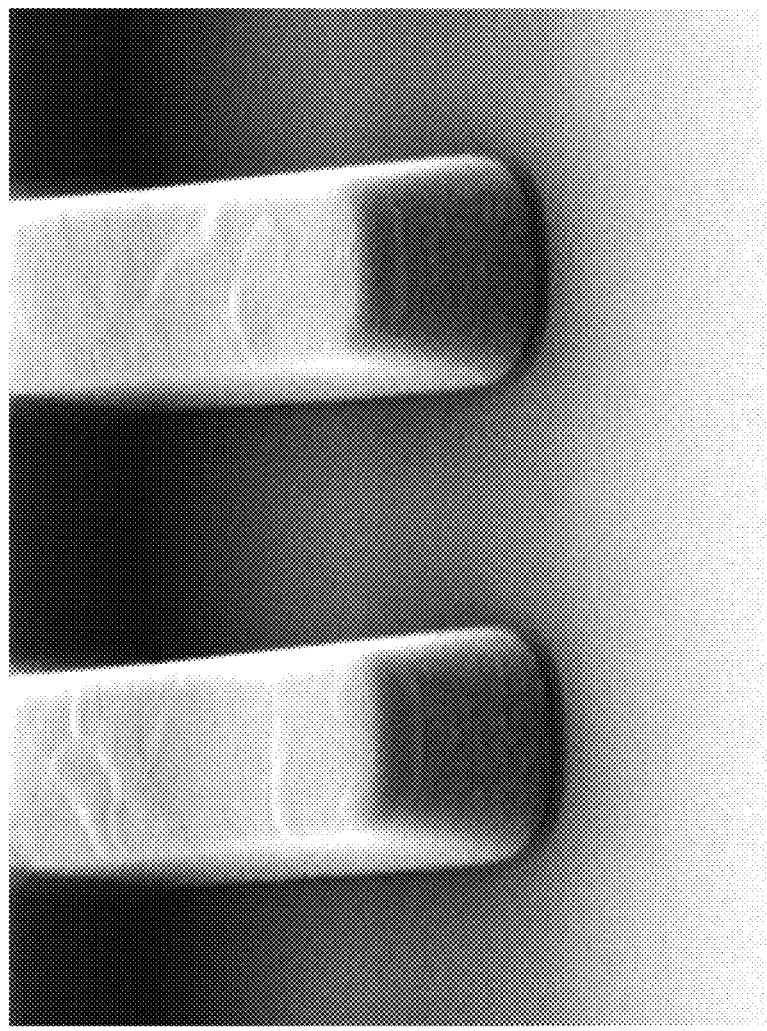
FIGS. 4 (A) and (B) show SEM images of individual HBTs before and after the removal of the rigid dielectric material around the electrical interconnect structure.
Figure 4B:
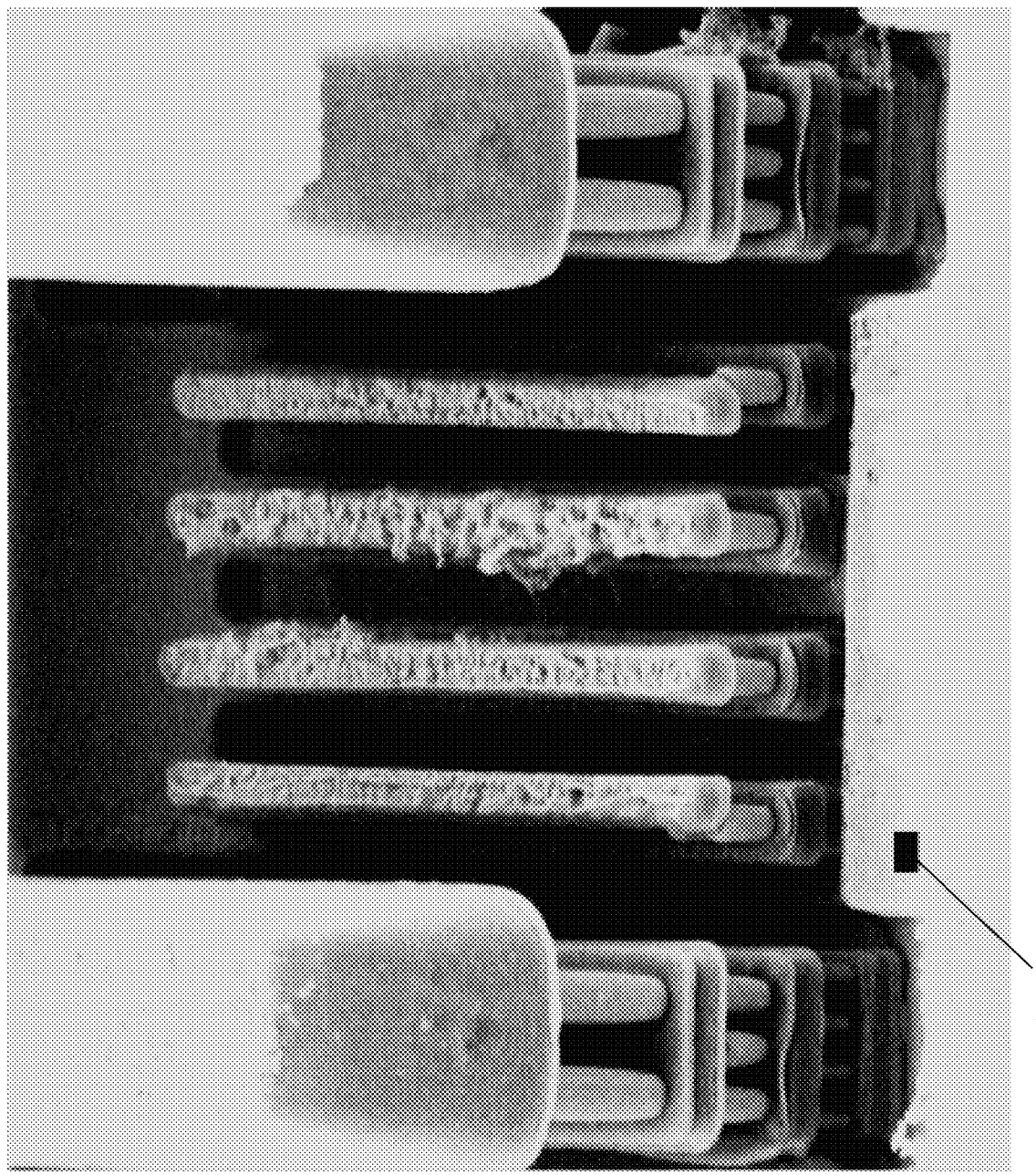

Results:

In order to examine the details of the rigid dielectric removal process, scanning electron microscope (SEM) images of the structures were taken after the removal of the rigid $SiO_2$. FIGS. 3(A) and (C) show the SEM images of the device subcell and upper level regions of the original PA integrated circuit. After removing the rigid inter-metal dielectric $SiO_2$ layers, as revealed in FIGS. 3(B) and (D), the dense multilevel metal interconnect "skeleton" of the integrated circuit were exposed. FIGS. 4(A) and 4(B) show the SEM images of individual HBT devices before and after etching the rigid dielectric material, respectively.

To assess the flexibility improvement provided by the present methods, an FEM simulation was conducted. For comparison purposes, three structures, each having two electrical interconnect levels, were simulated. The first structure retained the rigid oxide material between interconnect levels, but its front and back sides were coated with PDMS. The second structure had PDMS around the interconnect structure and coated on its front and back sides, such that the electrical interconnect structure was entirely embedded in PDMS. A third structure, having a thin layer of the rigid dielectric material remaining on its back side and between the interconnect levels, had PDMS coated on its front side and below the thin rigid dielectric layer on its back side. All three structures had exactly the same dimensions. Applying the same bending force on the structures resulted in significant differences in flexibility (i.e., a difference of several hundred times in displacement along the bending direction).

To further validate the simulation results, additional structures were fabricated. For example, a fourth structure retained the rigid dielectric $SiO_2$ around the interconnect structure. This structure, which was a ~3 µm thick (after back side Si thinning) integrated circuit chip was coated with PDMS on both sides and exhibited only modest flexibility. It cracked upon bending at a radius of 20 mm. In comparison, after removal of the rigid dielectric layers and backfilling and embedding in PDMS, flexible chips having a much larger thickness (i.e., four metal layers, top metal thickness ~5 µm), could be rounded around a tweezer tip (i.e., a bending radius ≤20 mm) without any cracks, demonstrating their superior mechanical properties and robustness. The DC and small-signal AC characteristics of the devices were measured to evaluate the performance of the flexible chips. GSG probes and a network analyzer were used for the RF characterizations during the measurements. While possessing a superior bendability, the flexible HBT devices exhibited an extremely high frequency response: individual HBT device had a figure of merit fmax over 40 GHz.

When the bending radius was varied, the HBT device showed a slight change in the collector current and small-signal power gain from 1-5 GHz, but no substantial performance change on the base current, power gain above 5 GHz or fmax. The scattering parameters (S-parameter) of the power amplifier circuit were also measured. The flexible power amplifier circuit with multilevel metal interconnects exhibited ~14 dB power gain at ~24 GHz (~17.5 dB at ~6.5 GHz). There was no substantial performance change of the individual devices or power amplifier ICs after severe bending or even twisting. Overall, the superior electrical performance (e.g., high frequency response characteristics) of the rigid chips was retained by the transformed flexible chips made with the present methods.

A performance comparison between the flexible chips and their original rigid counterparts was conducted. Only a very slight, but tolerable, degradation in the performance of the flexible electronics was observed. This might be attributed to the inferior thermal properties and device passivation compared to the original rigid devices.

Any performance degradation may be further minimized by implementing a special protection layer (e.g., dummy metal pads) for the active device regions during fabrication. If the device region is properly protected via careful control of the etching process and/or the use of a protection layer that can be applied during the device/circuit fabrication process, the present methods can be applied to any electronics built on semiconductor wafers (e.g., MOSFETs, HEMT, etc.) without sacrificing device performance.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art, all language such as "up to," "at least," "greater than," "less than," and the like includes the number recited and refers to ranges which can be subsequently broken down into subranges as discussed above. Finally, as will be understood by one skilled in the art, a range includes each individual member.

It is specifically intended that the present invention not be limited to the embodiments and illustrations contained herein, but include modified forms of those embodiments including portions of the embodiments and combinations of elements of different embodiments as come within the scope of the following claims.

What is claimed is:

1. A method for fabricating a flexible device from a rigid device comprising: a multilevel electronic device structure comprising at least two electronic components electrically connected by an electrical interconnect structure having multiple interconnect levels along the vertical axis of the device; and a rigid dielectric material disposed around the electrical interconnect structure, including within spaces between the interconnect levels, the method comprising:
   (a) removing the rigid dielectric material to expose the electrical interconnect structure;
   (b) backfilling the resulting spaces between the interconnect levels with a liquid elastomeric dielectric precursor; and
   (c) curing the liquid elastomeric dielectric precursor to form an elastomeric dielectric material between the interconnect levels.

2. The method of claim 1, further comprising coating a front side and a back side of the electronic device structure with a liquid elastomeric dielectric precursor, and curing the liquid elastomeric dielectric precursor to form an elastomeric material on the front side and the back side of the electronic device structure, such that the electronic components and the electrical interconnect structure are encased in elastomeric dielectric material.

3. The method of claim 1, wherein removing the rigid dielectric material comprises etching the rigid dielectric material with an etchant that selectively removes the rigid dielectric material.

4. The method of claim 3, wherein the rigid dielectric material comprises $SiO_2$, $SiN_x$ or a combination thereof and the etchant comprises HF.

5. The method of claim 3, further comprising protecting one or more device active regions prior to etching the rigid dielectric material.

6. The method of claim 1, wherein the elastomeric dielectric material comprises PDMS.

7. The method of claim 1, wherein the device comprising an integrated circuit having at least two transistors electrically connected by the electrical interconnect structure.

* * * * *

UNITED STATES PATENT AND TRADEMARK OFFICE
CERTIFICATE OF CORRECTION

| | | |
|---|---|---|
| PATENT NO. | : 11,109,486 B2 | Page 1 of 2 |
| APPLICATION NO. | : 16/658515 | |
| DATED | : August 31, 2021 | |
| INVENTOR(S) | : Zhenqiang Ma et al. | |

It is certified that error appears in the above-identified patent and that said Letters Patent is hereby corrected as shown below:

In the Drawings

Please replace Sheet 2, with the attached Sheet 2, showing the corrected Figure.

Signed and Sealed this
First Day of November, 2022

Katherine Kelly Vidal
*Director of the United States Patent and Trademark Office*

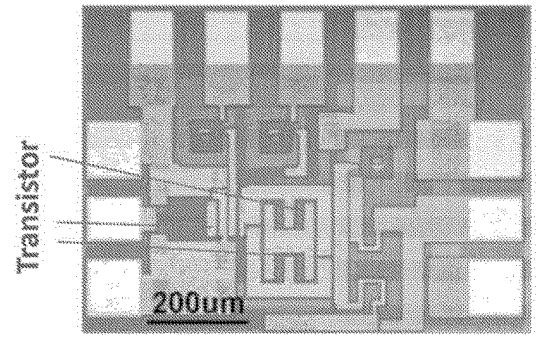
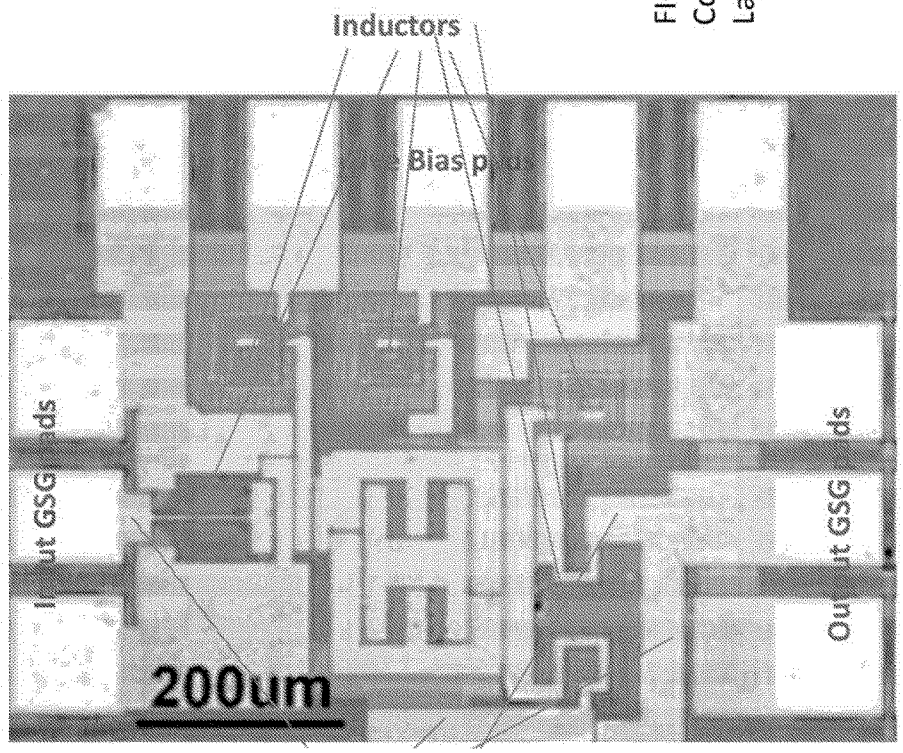
FIG. 2 with Components Labeled